United States Patent
Götzenberger et al.

(10) Patent No.: US 10,636,956 B2
(45) Date of Patent: Apr. 28, 2020

(54) CIRCUIT ARRANGEMENT FOR CHARGING AND DISCHARGING A PIEZO ACTUATOR

(71) Applicant: CONTINENTAL AUTOMOTIVE GMBH, Hannover (DE)

(72) Inventors: Martin Götzenberger, Ingolstadt (DE); Walter Schrod, Regensburg (DE)

(73) Assignee: Vitesco Technologies GmbH, Hannover (DE)

( * ) Notice: Subject to any disclaimer, the term of this patent is extended or adjusted under 35 U.S.C. 154(b) by 405 days.

(21) Appl. No.: 15/451,027

(22) Filed: Mar. 6, 2017

(65) Prior Publication Data

US 2017/0288119 A1  Oct. 5, 2017

(30) Foreign Application Priority Data

Mar. 31, 2016 (DE) .................. 10 2016 205 375

(51) Int. Cl.
| | | |
|---|---|---|
| H01L 41/09 | (2006.01) | |
| H01L 41/04 | (2006.01) | |
| H02N 2/06 | (2006.01) | |
| H02M 3/155 | (2006.01) | |
| F02M 51/06 | (2006.01) | |

(52) U.S. Cl.
CPC ............ *H01L 41/042* (2013.01); *H01L 41/09* (2013.01); *H02M 3/155* (2013.01); *H02N 2/06* (2013.01); *F02M 51/0603* (2013.01)

(58) Field of Classification Search
CPC ...... H01L 41/042; H01L 41/09; H02M 3/155; H02N 2/06; F02M 51/0603
USPC ........................................................ 310/317
See application file for complete search history.

(56) References Cited

U.S. PATENT DOCUMENTS

| | | | | |
|---|---|---|---|---|
| 4,743,789 | A * | 5/1988 | Puskas ................. | B06B 1/0223 310/316.01 |
| 6,147,433 | A * | 11/2000 | Reineke .............. | F02D 41/2096 310/316.03 |
| 2005/0225202 | A1 * | 10/2005 | Vogeley ................ | F04B 43/046 310/317 |
| 2011/0273057 | A1 * | 11/2011 | Nouvel ............... | F02D 41/2096 310/317 |

(Continued)

FOREIGN PATENT DOCUMENTS

| | | |
|---|---|---|
| CN | 102025339 A | 4/2011 |
| CN | 103368456 A | 10/2013 |
| CN | 104205609 A | 12/2014 |

(Continued)

OTHER PUBLICATIONS

Chinese Office Action dated Apr. 25, 2019 for corresponding Chinese Patent Application No. 201710216357.7.

(Continued)

*Primary Examiner* — Thomas M Dougherty

(57) ABSTRACT

The disclosure relates to a circuit arrangement that includes a first DC-DC converter that is connected on the output side to a capacitor. A first terminal of the capacitor is a supply voltage terminal and a second terminal of the capacitor is a reference potential terminal. The circuit arrangement also includes a second DC-DC converter, which is connected on the input side with the capacitor and on the output side to a first terminal of a piezo actuator. The second terminal of the piezo actuator is connected to the first terminal of the capacitor.

6 Claims, 1 Drawing Sheet

(56) References Cited

U.S. PATENT DOCUMENTS

2013/0264909 A1  10/2013  Glaser
2013/0336035 A1  12/2013  Ramabhadran et al.

FOREIGN PATENT DOCUMENTS

| | | |
|---|---|---|
| CN | 104426422 A | 3/2015 |
| DE | 19927190 A1 | 12/2000 |
| DE | 102005016279 A1 | 10/2006 |
| DE | 102006019404 A1 | 10/2007 |
| DE | 202009007299 U1 | 8/2009 |
| DE | 102012204576 A1 | 9/2013 |
| EP | 1276159 A1 | 1/2003 |
| EP | 2254170 A2 | 11/2010 |

OTHER PUBLICATIONS

Chinese Notification to Grant Patent Right for Invention dated Oct. 22, 2019 for corresponding Chinese Patent Application No. 201710216357.7.
German Office Action dated Oct. 14, 2016 for corresponding German Patent Application No. 10 2016 205 375.2.
German Notice of Allowance dated Feb. 27, 2017 for corresponding German Patent Application No. 10 2016 205 375.2.

\* cited by examiner

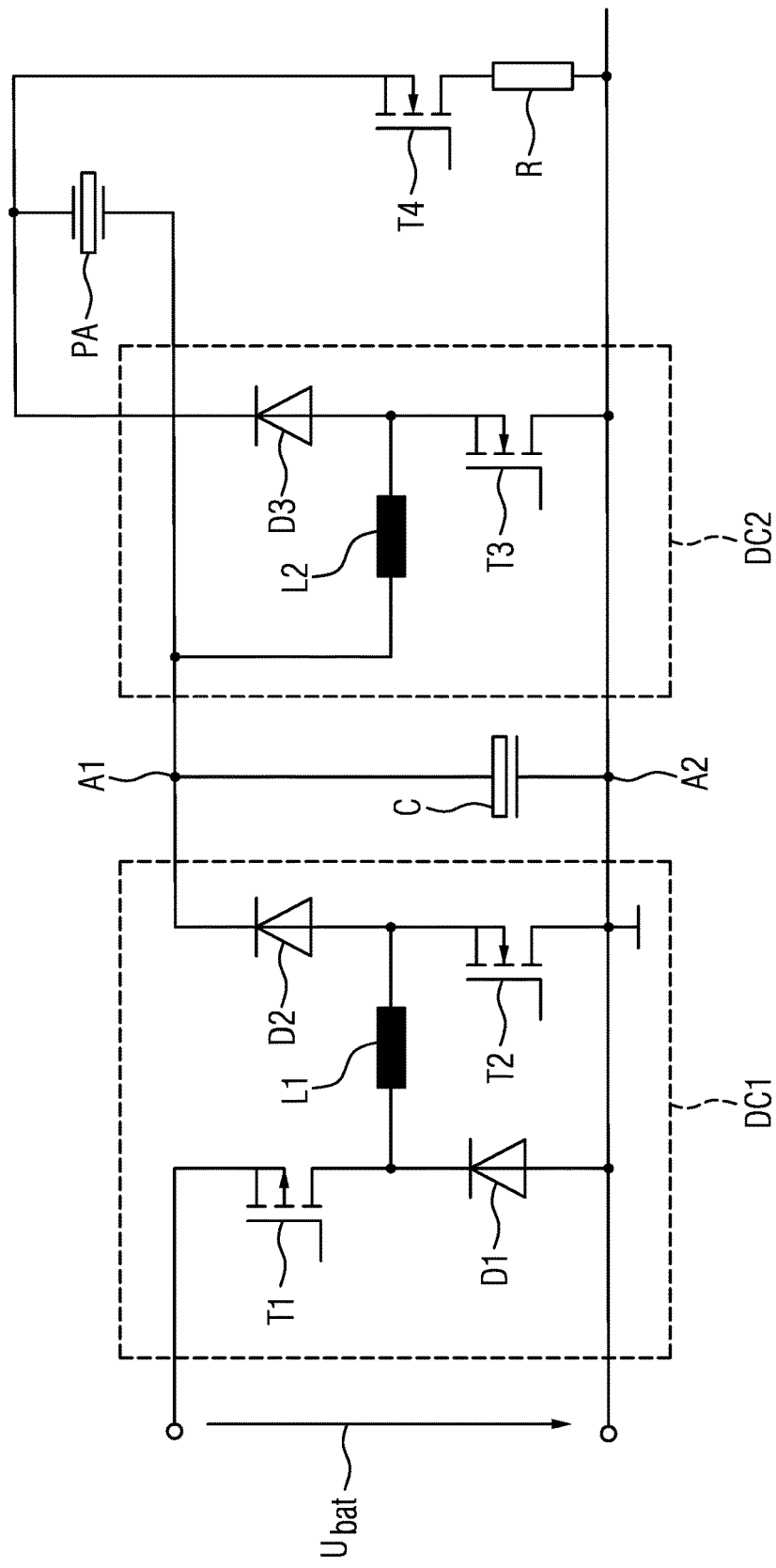

US 10,636,956 B2

CIRCUIT ARRANGEMENT FOR CHARGING AND DISCHARGING A PIEZO ACTUATOR

CROSS-REFERENCE TO RELATED APPLICATIONS

This application claims priority, under 35 U.S.C. 119, to German patent application DE 10 2016 205 375.2, filed Mar. 31, 2016, the content of which is hereby incorporated by reference herein in its entirety.

TECHNICAL FIELD

The disclosure relates to a circuit arrangement for charging and discharging a piezo actuator.

BACKGROUND

Piezo actuators change their form, for example their length, when they are subjected to an electrical voltage, and can in this process exert significant force on, for example, plungers of valves. They may therefore be used in fuel injection valves where, however, due to the high dynamic performance required, they must be operated with complex end stages and drive concepts.

A further use of a piezo actuator is described in German Patent application DE 10 2006 019 404 A1. There, the piezo actuator operates on the piston face of a pressure reducer operated in a pressure regulator of a CNG-driven motor vehicle (CNG: compressed natural gas). With the help of a piezo actuator acting on the valve of an excess flow mechanism, the gas pressure in the working chamber of the control unit can be changed in a targeted manner. A at the same time the position of the valve of the excess flow mechanism of the pressure reducer can be affected, and its output pressure thereby adjusted to a predetermined setpoint value.

The end stage that is necessary to drive the piezo actuator must be able to statically adjust the voltage at the piezo actuator; on the other hand, low demands are placed on the dynamic performance in comparison with piezo fuel injection valves. The end stage must, however, also be capable of adjusting the voltage precisely even at very low voltages. Since the pressure reducer is in competition with unregulated systems, there is nevertheless a particular pressure on costs.

DC-DC converters, as are described in German Patent application DE 10 2012 204 576 A1, may be considered for the voltage supply or drive of the piezo actuator. The DC-DC converter described there is designed as an H-bridge converter, and an additional dissipative path is provided for discharging the piezo actuator.

As an alternative to this, German Patent application DE 10 2005 016 279 A1 discloses a DC-DC converter that is designed as a flyback converter that is connected on the input side with a capacitor that is fed by a further upstream DC-DC converter. Here again, an additional dissipative path is present for discharging connected piezo actuators.

SUMMARY

It is therefore the object of the disclosure to provide a circuit arrangement for charging and discharging a piezo actuator that is also capable of setting the voltage accurately even at very low voltages, and that in doing so can be implemented economically.

One aspect of the disclosure provides a circuit arrangement constructed with a first DC-DC converter that is connected on the output side to a capacitor. A first terminal of the capacitor is a supply voltage terminal and a second terminal of the capacitor is a reference potential terminal. The circuit arrangement also includes a second DC-DC converter, which is connected on the input side to the capacitor and on the output side to a first terminal of a piezo actuator. The second terminal of the piezo actuator is connected to the supply voltage terminal of the capacitor.

Implementations of the disclosure may include one or more of the following optional features. In some implementations, an on-board electrical system voltage is initially stabilized with the aid of the first DC-DC converter. In some examples, the first DC-DC converter is designed as a step-up converter. The step-up converter may be designed as a half-controlled half-bridge converter. The piezo actuator is not connected with one terminal to the reference potential, which is usually the ground potential, but to the supplying voltage at the capacitor. An inverting voltage converter, which takes the stabilized supply voltage of the capacitor as its reference, is used as the charging end stage, and converts the reference potential, which is negative with respect to this potential, into a positive voltage. Only an independently operating, dissipative path is used as the discharging end stage.

In some implementations, the first DC-DC converter is designed as a step-up converter, this being formed in an implementation with a half-bridge, whose first bridge branch is formed with the series connection of a first transistor and a first diode and whose second bridge branch is formed with the series connection of a second diode and a second transistor, and a coil is arranged in their bridge.

Due to the low powers, a complex scheme for driving the transistors can be omitted from this half-bridge converter, and both half-bridges can in general be operated simultaneously. The voltage obtained in this way can at the same time be used as a power supply and as a supply for the gate drives of the MOS transistors.

In some implementations, the second DC-DC converter is formed with a series connection of a coil and a switching element connected between its input terminals, whose connecting point is joined to the output terminal of the second DC-DC converter through a diode connected in the forward biased direction.

The charging end stage is thus constructed very simply and includes a choke, of a switching element—usually a MOSFET—referenced to the reference potential, and a freewheeling diode.

The discharging end stage is also easy to implement. A switching element, also referenced to ground, but operated in a current-regulated manner, also typically implemented as a MOSFET, discharges the positive terminal of the piezo actuator to the reference potential. A low voltage referenced to the buffered supply at the piezo actuator for the discharging therefore does not represent a special state. A voltage of several volts is still dropped across the current sink transistor even when the voltage at the piezo actuator is 0 volts.

The details of one or more implementations of the disclosure are set forth in the accompanying drawings and the description below. Other aspects, features, and advantages will be apparent from the description and drawings, and from the claims.

DESCRIPTION OF DRAWINGS

The disclosure is to be explained in more detail below on the basis of an example with the help of a figure. Here:

FIG. 1 shows a schematic diagram of a DC-DC converter.

DETAILED DESCRIPTION

The circuit arrangement for charging and discharging a piezo actuator PA according to FIG. 1 is formed with a first DC-DC converter DC1 which converts an input voltage Ubat, which can, for example, be the voltage of a vehicle battery, into a voltage at a capacitor C, so stabilizing the input voltage Ubat. The voltage at capacitor C, which is connected between two terminals A1 and A2, where terminal A2 is a reference potential terminal, is transmitted through a second DC-DC converter DC2 to the piezo actuator PA. The piezo actuator PA is connected between the output terminal of the second DC-DC converter DC2 and the supply potential terminal A1 of the capacitor C. The terminal of the piezo actuator PA that is connected to the output of the second DC-DC converter DC2 is, moreover, connected via a discharge switching means T4 and a resistor R to the reference potential terminal A2. The piezo actuator PA can be discharged through this discharge switching means T4.

The first DC-DC converter DC1 is formed in the illustrated example with a switched bridge circuit, where, in a first bridge pillar, the series circuit of a first switching means T1, which is implemented as a MOSFET, and a first diode D1, whose polarity is in the blocking direction, is connected between the terminals of the input voltage Ubat. Between the supply potential terminal A1 and the reference potential terminal A2, a second series circuit of a second diode D2, whose polarity is in the blocking direction, and a second switching means T2, which is also implemented as a MOSFET, is connected as the second bridge pillar. A first coil L1 is connected as the bridge of the bridge circuit between the connecting points of the first switching means T1 and the first diode D1 and of the second diode D2 and the second switching means T4. By means of this DC-DC converter (i.e., the first DC-DC converter DC1)—switched by a control circuit that is not illustrated—the input voltage Ubat, which often is a motor vehicle battery subject to changing loads, is stabilized, so that the voltage of the capacitor C has a desired, almost constant, value.

In the illustrated example, the second DC-DC converter DC2 is, designed as a step-up converter formed with few components, in which the series connection of a second coil L2 and of a third switching means T3, which is also implemented as a MOSFET, is connected between the supply potential terminal A1 and the reference potential terminal A2. A third, forward-biased, diode D3 is connected between the connecting point of the second coil L2 and the third switching means T3 and the output terminal of the second DC-DC converter DC2. The voltage at the piezo actuator PA is charged to a desired voltage by a control circuit, not illustrated, in the known manner—for example by means of pulse-width modulated drive of the switching means T3.

The second DC-DC converter DC2 can also be considered as an inverting converter if the supply potential A1 is thought of as a new reference potential, and the potential at the reference potential terminal A2 is thought of, in contrast, as a negative potential that is transformed into a positive potential at the piezo actuator PA.

Through the circuit arrangement for charging and discharging a piezo actuator PA, a circuit arrangement that can be realized with few, economical components, is shown, which meets the requirements for the operation of a pressure regulator for a pressure reducer in a CNG-driven motor vehicle in a simple and economical manner.

A number of implementations have been described. Nevertheless, it will be understood that various modifications may be made without departing from the spirit and scope of the disclosure. Accordingly, other implementations are within the scope of the following claims.

What is claimed is:

1. A circuit arrangement comprising:
   a first DC-DC converter having an output side connected a capacitor, wherein a first terminal of the capacitor is a supply voltage terminal and a second terminal of the capacitor is a reference potential terminal; and
   a second DC-DC converter having an input side and an output side, the input side connected to the capacitor and the output side connected to a first terminal of a piezo actuator,
   wherein the second terminal of the piezo actuator is connected to the first terminal of the capacitor.

2. The circuit arrangement of claim 1, wherein the first terminal of the piezo actuator (PA) is connected through a switching element to the reference potential terminal.

3. The circuit arrangement of claim 1, wherein the second DC-DC converter is configured as a step-up converter.

4. The circuit arrangement of claim 1, wherein the first DC-DC converter is configured as a step-up converter.

5. The circuit arrangement of claim 4, wherein the first DC-DC converter is formed with a bridge circuit, the bridge circuit comprising:
   a first bridge pillar formed with a series connection of a first transistor and a first diode;
   a second bridge pillar formed with a series connection of a second diode and a second transistor; and
   a coil arranged in the bridge of the first bridge pillar and the second bridge pillar.

6. The circuit arrangement of claim 1, wherein the second DC-DC converter is formed with a series connection of a second coil and a third switching element connected between input terminals of the second DC-DC converter, whose connecting point is joined to an output terminal of the second DC-DC converter through a third diode connected in a forward biased direction.

* * * * *